United States Patent [19]
Yamakawa et al.

[11] Patent Number: 5,326,623
[45] Date of Patent: Jul. 5, 1994

[54] CIRCUIT BOARD

[75] Inventors: Koji Yamakawa; Kaoru Koiwa; Takaaki Yasumoto; Kiyoshi Iyogi, all of Kawasaki; Nobuo Iwase, Kamakura, all of Japan

[73] Assignee: Kabushiki Kaisha Toshiba, Kawasaki, Japan

[21] Appl. No.: 10,298

[22] Filed: Jan. 28, 1993

[30] Foreign Application Priority Data

Jan. 28, 1992 [JP] Japan .................................. 4-012846

[51] Int. Cl.$^5$ .............................................. B32B 9/00
[52] U.S. Cl. .................................... 428/210; 428/209; 428/901
[58] Field of Search .................... 428/209, 210, 901

[56] References Cited

U.S. PATENT DOCUMENTS 5,041,700  8/1991  Iyogi et al. ........................ 174/255

OTHER PUBLICATIONS

Proceedings of 1986 VMIC Conference, C.-K. Hu, et al., pp. 181-187, Jun. 9-10, 1986, "Diffusion Barrier Studies for CU."
Proceedings of 1989 VMIC Conference, K. Hoshino, et al., pp. 226-233, Jun. 12-13, 1989, "Tin-Encapsulized Copper Interconnects for ULSI Applications."
Microelectronics Packaging Handbook, Chp. 9, Sec. 6, 1989, R. O. Tummala, et al., "Thin-Film Materials and Processes."

*Primary Examiner*—Patrick J. Ryan
*Assistant Examiner*—Kam Lee
*Attorney, Agent, or Firm*—Oblon, Spivak, McClelland, Maier & Neustadt

[57] ABSTRACT

A circuit board including a circuit pattern adhered firmly to a ceramic substrate and capable of eliminating an increase in resistivity due to an influence of an external environment, particularly, a thermal influence is disclosed. The circuit board comprises a ceramic substrate, and a circuit pattern formed on the substrate and having a multilayered structure in which a bonding layer comprising Ti and at least one element selected from the group consisting of N and O, a conductor layer consisting essentially of Cu, and a protective layer comprising Ti and at least one element selected from the group consisting of N and O are stacked in the order named.

18 Claims, 3 Drawing Sheets

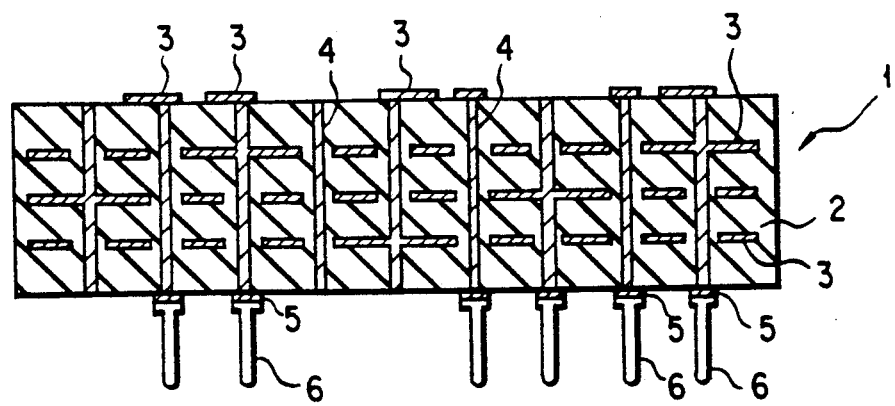
F I G. 1
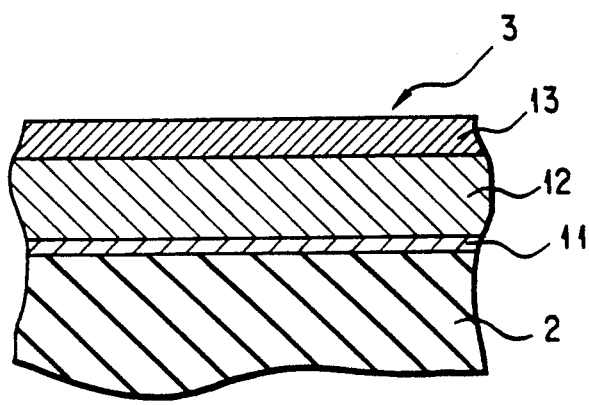
F I G. 2
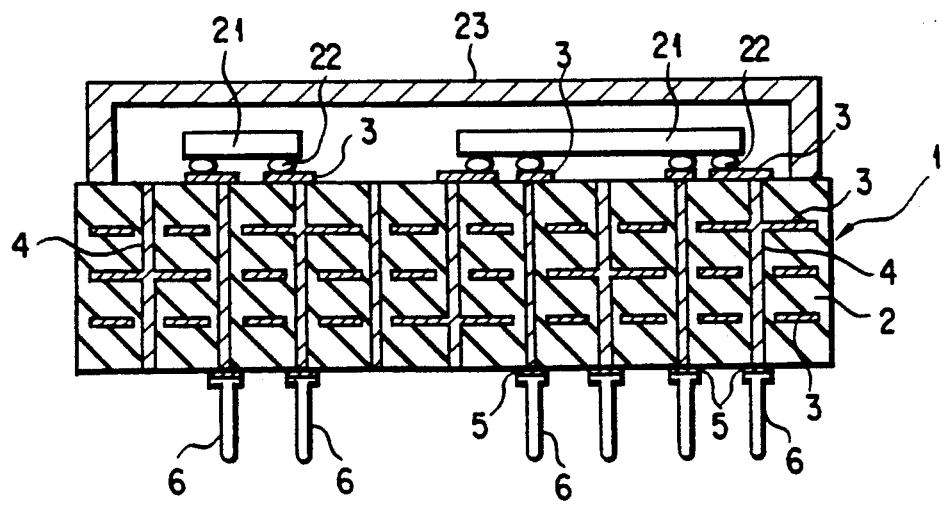
F I G. 5

CIRCUIT BOARD

BACKGROUND OF THE INVENTION

1. Field of the Invention

The present invention relates to a circuit board fabricated by forming a circuit pattern having a multilayered structure on a ceramic substrate.

2. Description of the Related Art

A circuit board having a structure in which a circuit pattern is formed on a ceramic substrate is used by mounting, e.g., semiconductor chips on it. Recently, the integration degree, and power consumption of semiconductor chips, such as LSI chips and VLSI chips, are increasing. Therefore, a circuit board for mounting semiconductor chips, such as LSI chips, is required to have a higher adhesion between the ceramic substrate and the circuit pattern, a lower resistance of the circuit pattern, and better heat removal properties of the board than before. Also, in order to mount semiconductor chips, pin bonding regions are formed on the circuit board, and a large number of leads (e.g., pins) are bonded by using a brazing material.

A conventionally known example of a circuit board of this type is disclosed in Published Unexamined Japanese Patent Application No. 1-223737. This circuit board is fabricated by forming, on the surface of a ceramic substrate consisting of an aluminum nitride (AlN) sintered material, a circuit pattern having a multilayered structure in which a first layer consisting of at least one element selected from the group consisting of Ti, Cr, Mo, and W, a second layer consisting of Ni or Cu, and a third layer consisting of Au are stacked in sequence.

If, however, the circuit board having a circuit pattern constituted by a multilayered structure of, e.g., Ti/-Ni/Au, is exposed to heat during bonding of pins or packaging of semiconductor chips, the individual layer elements of the circuit pattern diffuse each other to increase the resistance significantly.

Published Unexamined Japanese Patent Application No. 64-84648 discloses a circuit board fabricated by forming a circuit pattern having a two-layered structure of Ti/Cu on a ceramic substrate consisting of an AlN sintered material. In this circuit board, however, the adhesion strength between the ceramic substrate and the circuit pattern is insufficient. In addition, when the circuit board is accepted a thermal influence, the individual elements of the circuit pattern diffuse each other to increase the resistance.

SUMMARY OF THE INVENTION

It is an object of the present invention to provide a circuit board with a circuit pattern which is firmly adhered to a ceramic substrate.

It is another object of the present invention to provide a circuit board with a circuit pattern, which can suppress an increase in resistance due to an influence of external environments, particularly, a thermal influence.

According to the present invention, there is provided a circuit board comprising:

a ceramic substrate; and a circuit pattern found on the substrate and having a multilayered structure in which a bonding layer comprising Ti and at least one element selected from the group consisting of N and O, a conductor layer consisting essentially of Cu, and a protective layer comprising Ti and at least one element selected from the group consisting of N and O are stacked in the order named.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 1 is a sectional view showing a circuit board according to the present invention;

FIG. 2 is an enlarged sectional view showing a circuit pattern formed on the circuit board shown in FIG. 1;

FIG. 5 is a sectional view showing a structure in which LSI chips are mounted on the circuit board shown in FIG. 1.

DETAILED DESCRIPTION OF THE PREFERRED EMBODIMENTS

Figure 3:
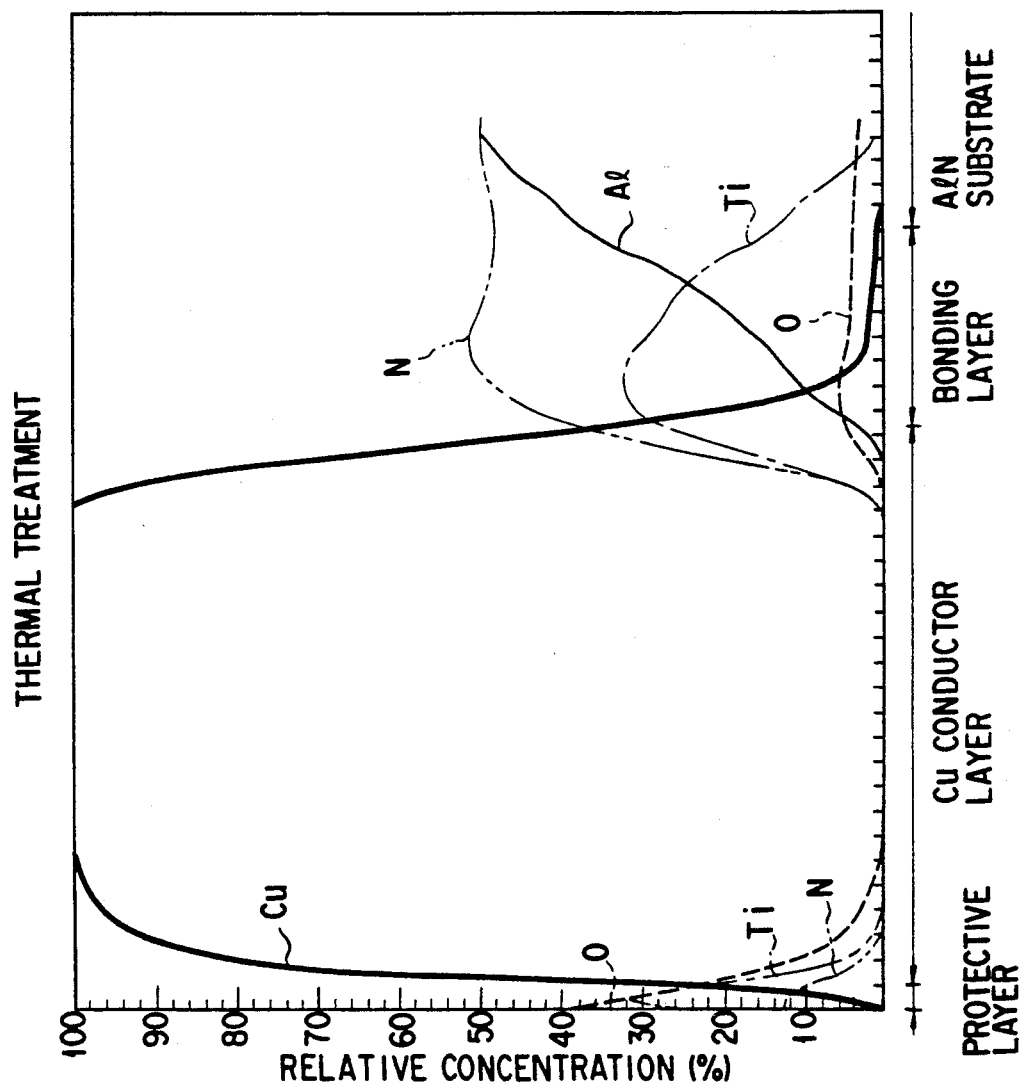
FIG. 3 is a graph showing a sectional element profile when a thin Ti film and a thin Cu film were formed in sequence on a substrate consisting of an AlN sintered material and the resultant structure was heated in a vacuum at 830° C.

A circuit board according to the present invention will be described in detail below with reference to FIGS. 1 and 2.

A circuit board 1 has a ceramic substrate 2. A plurality of circuit patterns 3 are formed on the surface and the interior of the ceramic substrate 2. A plurality of via holes 4 are formed in the direction of thickness of the ceramic substrate 2 so as to connect with desired layers of the circuit patterns 3. Pin bonding pads 5 are formed on the lower surface of the ceramic substrate 2 so as to connect with the via holes 4. I/O pins 6 for input/output are arranged at the positions of the pin bonding pads 5 and bonded to the pads with a brazing material interposed between them.

The ceramic substrate 2 consists of a low-dielectric constant material, such as glass ceramic or mullite (dielectric constant 4 to 7); a high-thermal conductivity material, such as an AlN sintered material or SiC; or alumina. To realize a circuit board with good heat removal properties, the ceramic substrate preferably consists of the high-thermal conductivity material. Most preferably, the ceramic substrate consists of an AlN sintered material with an oxygen content of 0.005 to 10 atom % and a thermal conductivity of 130 to 280 W/m·K. To realize a circuit board with a high reliability against a thermal stress, the ceramic substrate preferably consists of an AlN sintered material, mullite, or glass ceramic having a thermal expansion coefficient close to that of Si constituting semiconductor chips to be mounted. Alumina is an inexpensive, chemically stable substance and hence can be extensively used as the material of the ceramic substrate.

A high-melting point metal, such as W or Mo, is commonly used as the material of the circuit patterns 3 arranged inside the ceramic substrate 2. When the ceramic substrate 2 consists of glass ceramic formed by low-temperature sintering at about 1,000° C., the circuit patterns 3 are made of, e.g., a base metal such as Cu, or Ag.

As shown in FIG. 2, the circuit patterns 3 formed on the surface of the ceramic substrate 2 have a multilayered structure in which a bonding layer 11 comprising Ti and at least one of N and O, a conductor layer 12 consisting essentially of Cu, and a protective layer 13 comprising Ti and at least one of N and O are stacked, in the order named, on the surface of the substrate 2.

Ti and N and/or O contained in the bonding layer 11 may exist in the form of either a solid solution of N and/or O dissolved in Ti or a compound of Ti and N and/or O.

The composition of the bonding layer 11 is preferably such that Ti; 30 to 99.5 atom % and N and/or O; 0.5 to 70 atom %. The amounts of the individual components constituting the bonding layer 11 are limited to the above ranges for reasons explained below. That is, when the bonding layer 11 is formed by an ordinary film formation technique, the content of Ti hardly becomes less than 30 atom %. On the other hand, if the amount of Ti exceeds 99.5 atom %, the adhesion strength between the ceramic substrate 2 and the bonding layer 11 may be decreased. The bonding layer 11 more preferably consists of Ti; 50 to 99.5% and N and/or O; 0.5 to 50 atom %. Especially when both N and O are contained in the bonding layer 11, it is preferable that the total amount of these elements be 70 atom % or less.

The bonding layer 11 may contain Cu in addition to Ti and N and/or O. In this case, the content of Cu in the bonding layer 11 is preferably 50 atom % or less, and more preferably 20 atom % or less.

The bonding layer 11 may also contain the constituent elements of the ceramic substrate in addition to Ti and N and/or O. For example, when the ceramic substrate consists of an AlN sintered material, the bonding layer 11 may contain Al as the constituent element of the substrate. The content of the constituent element of the substrate in the bonding layer 11 is preferably 11 atom % or less.

The bonding layer 11 desirably has a thickness of 2 to 1,000 nm. The thickness of the bonding layer 11 is so defined for the reasons to be explained below. That is, if the thickness of the bonding layer is less than 2 nm, it is difficult to sufficiently increase the adhesion strength between the ceramic substrate 2 and the bonding layer. If, on the other hand, the thickness of the bonding layer 11 exceeds 1,000 nm, a time required for formation of the bonding layer 11 by using, e.g., a sputtering process is undesirably prolonged. The bonding layer 11 more preferably has a thickness of 10 to 500 nm.

The conductor layer 12 consists of Cu alone or Cu containing 5 atom % or less of Ti. In the conductor layer 12 consisting of Cu containing 5 atom % or less of Ti, the content of Ti is so defined because, if the content of Ti in the conductor layer 12 exceeds 5 atom %, the resistivity of the conductor layer 12 may increase.

The conductor layer 12 preferably has a thickness of 0.2 to 20 $\mu$m. The thickness of the conductor layer 12 is so defined for the reasons to be explained below. That is, if the thickness of the conductor layer 12 is less than 0.2 $\mu$m, the resistivity of the conductor layer 12 may increase, or the circuit patterns 3 comprising the conductor layer 12 may cause disconnections due to a thermal shock. On the other hand, if the thickness of the conductor layer 12 exceeds 20 $\mu$m, it may become difficult to perform micropatterning.

Ti and N and/or O contained in the protective layer 13 may exist in the form of either a solid solution of N and/or O dissolved in Ti or a compound of Ti and N and/or O.

The composition of the protective layer 13 is preferably such that Ti; 30 to 99.5 atom % and N and/or O; 0.5 to 70 atom %. The amounts of the individual components constituting the protective layer 13 are limited to the above ranges for the reasons to be explained below. That is, when the protective layer 13 is formed by a common film formation technique, the content of Ti hardly becomes less than 30 atom %. On the other hand, if the amount of Ti exceeds 99.5 atom %, the resistance to environment of the protective layer 13 may decrease. The protective layer 13 more preferably consists of Ti; 33 to 66 atom % and N and/or O; 34 to 67 atom %. Especially when both N and O are contained in the protective layer 13, the total amount of these elements is preferably 70 atom % or less.

The protective layer 13 may contain Cu in addition to Ti and N and/or O. The content of Cu in the bonding layer 11 is preferably 20 atom % or less, and more preferably 5 atom % or less. If the amount of Cu exceeds 20 atom %, the environmental resistance of the protective layer 13 may decrease.

The protective layer 13 preferably has a thickness of 5 to 1,000 nm. The thickness of the protective layer 13 is so defined for the following reasons. That is, if the thickness of the protective layer 13 is less than 5 nm, the environmental resistance of the protective layer 13 may decrease. If, on the other hand, the thickness of the protective layer 13 exceeds 1,000 nm, a time necessary for formation of the protective layer by the use of, e.g., a sputtering process is undesirably prolonged; if the protective layer 13 is to be removed, a time required for the removal is also prolonged. The protective layer 13 more preferably has a thickness of 3 to 300 nm.

In situations where semiconductor chips to be mounted and the circuit patterns 3 are connected with each other through wires, at least wire bonding portions of the protective layer 13 may be removed before bonding of the wires. In the case wherein the protective layer 13 is removed, a conductor layer consisting of, e.g., Ni/Au may be formed after the removal.

The pin bonding pads 5 preferably have a multilayered structure in which a bonding layer, a conductor layer, and a protective layer are stacked in the order named, as described above with reference to FIG. 2. Before bonding the I/O pins 6 to the pin bonding pads having the multilayered structure via a brazing material, the protective layer as the uppermost layer may be removed. When the protective layer is to be removed, a conductor layer of, e.g., Ni/Au may be formed after the removal. The pin bonding pads 5 may be of a structure other than multilayered structure. They may be made by thick-film technique and may be made of a W layer and a Ni layer plated on the W layer.

The I/O pins 6 consist of, e.g., Kovar (29 wt %Ni-17 wt % Co-Fe)

As the brazing material for bonding the pins 6 to the pin bonding pads 5, it is possible to use, for example, Ag-Cu (72 wt %Ag-Cu) alloy or Au-Sn alloy.

Note that the circuit board according to the present invention is not limited to a multilayered circuit board, as shown in FIGS. 1 and 2, in which circuit patterns are formed in a ceramic substrate. For example, the present invention is similarly applicable to a circuit board in which circuit patterns are formed only on the surface of a ceramic substrate. The present invention can also be applied to a circuit board with a simple shape having no I/O pins.

A heat sink for improving heat radiation properties may be mounted on the surface of the ceramic substrate on which the semiconductor chips are mounted.

An example of a method of fabricating the circuit board according to the present invention will be described below.

First, a thin film comprising Ti and at least one of N and O, a thin film consisting essentially of Cu, and a thin film comprising Ti and at least one of N and O are formed in the order named on the surface of a ceramic substrate. These thin films are formed by, e.g., a sputtering process. Subsequently, a resist pattern is formed on these thin films by photolithography, and the thin films are sequentially etched away by using the resist pattern as a mask. The result is the circuit patterns 3 having a multilayered structure in which the bonding layer 11 comprising Ti and at least one of N and O, the conductor layer 12 consisting essentially of Cu, and the protective layer 13 comprising Ti and at least one of N and O are stacked, in the order named, on the surface of the ceramic substrate 2, as shown in FIG. 2. In this manner, the circuit board according to the present invention is fabricated.

If the ceramic substrate is made of an AlN sintered material, the circuit board according to the present invention is fabricated by, for example, the following method.

First, a thin Ti film with a thickness of about 1 to 1,000 nm and a thin Cu film with a thickness of about 0.5 to 20 μm are formed in sequence on a ceramic substrate consisting of an AlN sintered material by a sputtering process, and these thin films are then patterned. Subsequently, a thermal treatment is performed in a vacuum or in a thermal treatment atmosphere at 600° to 1,000° C. With this thermal treatment, N as the constituent element of the substrate diffuses into the thin Ti film. Ti of the thin Ti film also diffuses to the upper surface of the thin Cu film, ultimately forming a Ti film on the upper surface of the Cu film. In the process, $N_2$ existing in the atmosphere or $O_2$ existing on the upper surface of the Cu film, or both diffuse into the Ti film being formed on the Cu film. This consequently forms circuit patterns having a multilayered structure in which a bonding layer comprising Ti and at least one of N and O, a conductor layer consisting essentially of Cu, and a protective layer comprising Ti and at least one of N and O are stacked, in the order named, on the surface of the ceramic substrate, thereby fabricating the circuit board according to the present invention.

The thermal treatment temperature is defined between 600° and 1,000° C. for the reasons to be explained below. That is, if the thermal treatment temperature is less than 600° C., it becomes difficult for Ti to diffuse from the thin Ti film coated on the surface of the substrate toward the upper surface side of the thin Cu film. As a result, the protective layer of the multilayered structure becomes difficult to form. In addition, since Ti stops at the Cu conductor layer formed below the protective layer and the concentration of Ti in the conductor layer therefore exceeds 5 atom %, the resistance of the conductor layer may increase. On the other hand, if the thermal treatment temperature exceeds 1,000° C., a microstructure of the ceramic substrate consisting of the AlN sintered material may be destroyed.

Although the time of thermal treatment depends on the thermal treatment temperature, the circuit patterns having the multilayered structure can be formed on the surface of the ceramic substrate by performing the thermal treatment for, e.g., 30 minutes or more for a temperature of 600° C., five minutes or more for 850° C., or 30 seconds or more for 1,000° C.

Figure 4:
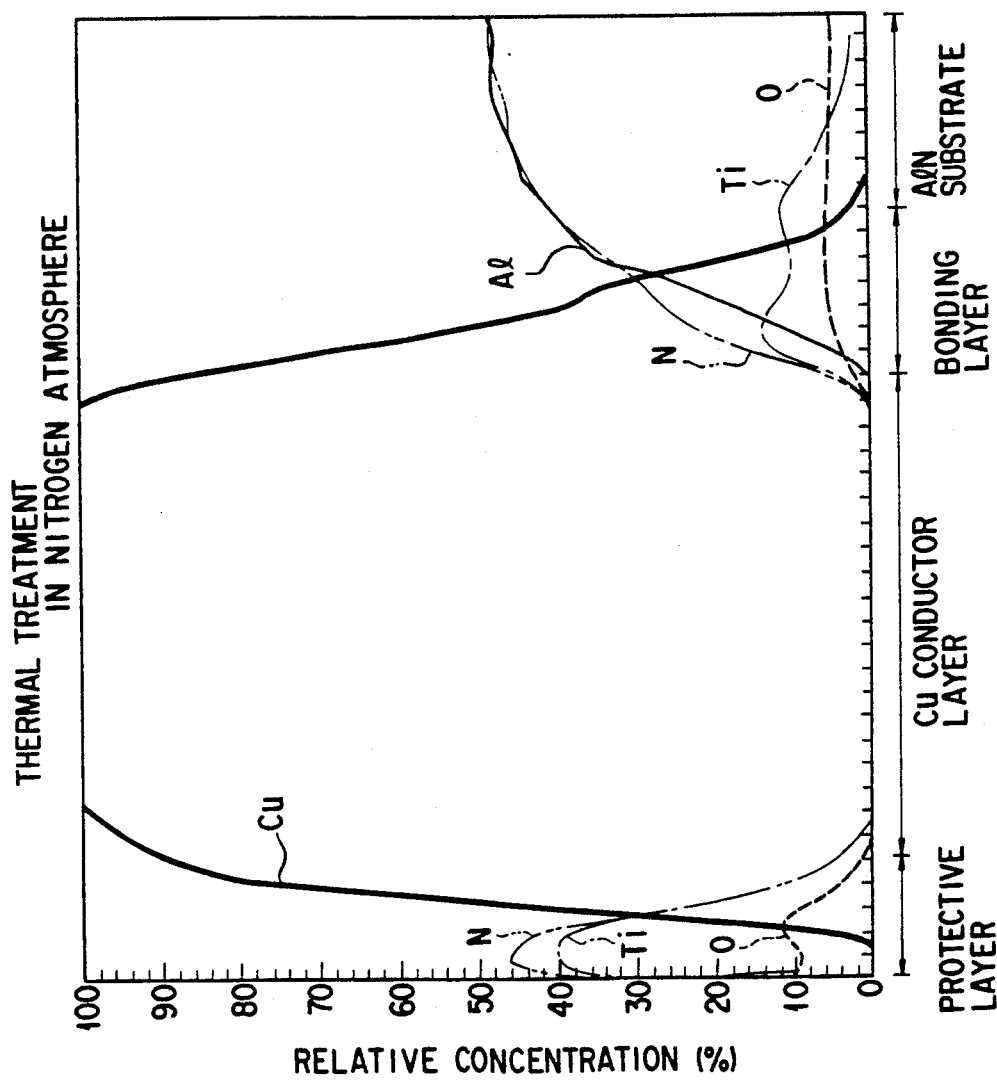
FIG. 4 is a graph showing a sectional element profile when a thin Ti film and a thin Cu film were formed in sequence on a substrate consisting of an AlN sintered material and the resultant structure was heated in a nitrogen atmosphere at 830° C.

FIG. 3 shows an element profile from the surface to inside a structure obtained when a thin Ti film and a thin Cu film were formed in sequence on a ceramic substrate consisting of an AlN sintered material and the resultant structure was heated in a vacuum at 830° C. FIG. 4 shows an element profile from the surface to inside a structure obtained when the substrate having these two thin films was heated in a nitrogen atmosphere at 830° C.

As can be seen from FIGS. 3 and 4, in either annealing, a layer (bonding layer) which is a mixture of Ti, N, and O is formed on the surface of the ceramic substrate consisting of an AlN sintered material, a layer (conductor layer) consisting essentially of Cu is formed on the bonding layer, and a layer (protective layer) which is a mixture of Ti, N, and O is formed on the conductor layer.

Semiconductor chips (e.g., LSI chips) are mounted on the circuit board according to the present invention, as shown in FIG. 5. That is, LSI chips 21 are arranged on the circuit patterns 3 on the surface of the ceramic substrate 2. The circuit patterns 3 and the LSI chips 21 are connected with each other by solder bumps 22 interposed between them. An encapsulating cap 23 is arranged on the surface of the ceramic substrate 2 so as to seal the LSI chips 21. The substrate 2 and the cap 23 are bonded with each other by a brazing material interposed between them.

The LSI chips 21 need not be connected to the circuit patterns 3 by the bumps but may be connected by bonding wires consisting of Au, Al, or Cu to the circuit patterns 3.

The cap 23 is made of a ceramic, such as mullite or AlN, or a metal, such as Kovar or a 42 alloy.

The circuit board according to the present invention comprises a circuit pattern having a multilayered structure in which a bonding layer, a conductor layer, and a protective layer, each having the above composition, are stacked in the order named on a ceramic substrate, and therefore capable of suppressing interdiffusion of the components of the individual layers even at high temperatures of, e.g., annealing. As a result, the circuit pattern can be adhered strongly to the ceramic substrate by the bonding layer, and this high adhesion strength with respect to the substrate can be maintained even if the structure is heated at a high temperature of, e.g., about 800° C.

In addition, since the conductor layer consists essentially of Cu, it is possible to realize a circuit board having a circuit pattern with a low resistance.

Furthermore, the conductor layer can be protected against an external environment by the protective layer having the above composition, and this prevents oxidation of the conductor layer even if the circuit pattern is heated at a high temperature of, e.g., about 800° C. Therefore, a circuit board having a circuit pattern maintaining a low initial resistivity can be realized.

Examples of the present invention will be described in detail below with reference to FIG. 1.

EXAMPLE 1

First, 1 wt % of a CaO powder and 3 wt % of a $Y_2O_3$ powder were added to an AlN powder having an oxygen content of 0.03 atom % and an average particle size of 15 μm, and polymethylmethacrylate was added to the mixture. The resultant mixture was kneaded in the presence of water to prepare a raw material. Subsequently, the material was costed by a doctor blade process to form a green sheet. Holes were formed in predetermined portions of the green sheet by using a drill, and a conductor paste containing tungsten was filled in these holes. A similar conductor paste was screen-printed on the surface of the green sheet to form a conductor paste pattern. Thereafter, a plurality of these green sheets were stacked, debindered, and sintered in a nitrogen atmosphere, thereby forming an AlN stacked substrate (ceramic substrate) with a thermal conductivity of 200 W/m·K having via holes consisting of tungsten and an internal circuit pattern.

Subsequently, lapping and polishing were performed for the ceramic substrate so as to obtain an average surface roughness of 150 nm or less, and both the surfaces of the ceramic substrate were subjected to wet cleaning. A thin Ti film 50 nm in thickness and a thin Cu film 1,000 nm in thickness were sequentially stacked on each of the two surfaces of the ceramic substrate by using a sputter deposition system.

Subsequently, a resist pattern was formed on the thin Cu film on the upper surface side of the ceramic substrate by photolithography, and the Cu film and the Ti film were selectively etched away in sequence by using the resist pattern as a mask, thereby forming a pattern having a two-layered structure. In addition, a resist pattern was formed on the thin Cu film on the lower surface side of the ceramic substrate by photolithography, and etching was similarly, selectively performed to form pin bonding regions.

Subsequently, I/O pins consisting of Kovar were temporarily fixed to the pin bonding regions by using a jig. Note that each I/O pin used had an Ag-Cu brazing material formed on its bonding end portion. Thereafter, the resultant structure was heated in a nitrogen atmosphere at 830° C. for five minutes to bond the pins to the pin bonding regions by the Ag-Cu brazing material. This thermal treatment formed a circuit pattern having a multilayered structure in which a 150-nm thick bonding layer consisting of 85 atom % of Ti, 7.5 atom % of N, and 7.5 atom % of Al, a 1,000-nm thick conductor layer consisting of Cu containing 1 atom % or less of Ti, and a 10-nm thick protective layer consisting of TiN (Ti; 50 atom %, N; 50 atom %) were stacked, in the order named, on the surface of the ceramic substrate. As a consequence, a circuit board having the structure shown in FIG. 1 was fabricated.

COMPARATIVE EXAMPLE

A thin Ti film 50 nm in thickness, a thin Ni film 500 nm in thickness, and a thin Au film 2,000 nm in thickness were stacked in sequence on each of the two surfaces of a ceramic substrate similar to that of Example 1 by using a sputter deposition system, and the Ti/Ni/Au stacked films on the two surfaces were sequentially, selectively patterned to form a conductor pattern and pin bonding regions. Thereafter, I/O pins were temporarily fixed to these pin bonding regions by using a jig, and thermal treatment was performed in a nitrogen atmosphere at 830° C. to bond the pins to the pin bonding regions by the use of an Ag-Cu brazing material interposed between them, thereby fabricating a circuit board.

Measurement was performed for the resistivity of the circuit pattern on the surface of each of the circuit boards according to Example 1 and the comparative example. Consequently, it was confirmed that the resistivity of the circuit pattern of Example 1 was as very low as 3.0 μΩ·cm, which was about 1.5 times that of a circuit pattern consisting of Cu alone. In contrast, the resistivity of the circuit pattern of the comparative example was very high, 20 μΩ·cm, which was about ten times the resistivity (2.5 μΩ·cm) before thermal treatment.

In addition, the circuit board of Example 1 was subjected to measurements of the tensile strength of the circuit pattern on the surface of the circuit board, and that of the I/O pins, with respect to the ceramic substrate. Note that the measurement of the tensile strength of the circuit pattern was made by forming the circuit pattern into a square sample of about 2 mm side by etching, bonding a pin having a diameter of 1 mm or more onto the sample by using a resin or a solder, and measuring the strength when the pin was pulled up vertically. As a result, it was confirmed that the tensile strengths of both the circuit pattern and the I/O pins were 5.5 kg/mm² or more.

Furthermore, the circuit board of Example 1 was again heated at 400° C. for 30 minutes by taking into account packaging of semiconductor chips and air-tight encapsulation of a cap. The circuit pattern formed in the circuit board heated was subjected to an AES analysis. As a result, almost no changes were found in compositions of the bonding layer, the conductor layer, and the protective layer compared to those before the thermal treatment. The values before the thermal treatment were also maintained in respect to the resistivity of the circuit pattern and the adhesion strength between the ceramic substrate and the circuit pattern.

EXAMPLE 2

Thin Ti films and thin Cu films having thicknesses listed in Table 1 below were stacked in sequence on the surfaces of ceramic substrates similar to that of Example 1 by using a sputter deposition system. These thin Cu films and thin Ti films were sequentially, selectively patterned to form patterns having two-layered structures, and thermal treatment was performed at temperatures listed in Table 1, thereby fabricating four types of circuit boards.

Following the same procedures as in Example 1, the tensile strength of the heated circuit pattern formed on each ceramic substrate was measured. Measurement was also performed for the resistivity of each circuit pattern. The results are summarized in Table 1. Note that Table 1 also shows the tensile strength and resistivity of a circuit pattern having the two-layered structure, which was not subjected to thermal treatment.

TABLE 1

| No. | Layer structure of pattern before thermal treatment | | Thermal Treatment temperature (°C.) | Thermal Treatment time (min) | Tensile Strength (kg/cm²) | Resistivity (μΩcm) |
|---|---|---|---|---|---|---|
| | Thin Ti film (nm) | Thin Cu film (nm) | | | | |
| 1 | 50 | 500 | — | — | 2.6 | 2.9 |
| 2 | 50 | 500 | 200 | 30 | 2.7 | 3.3 |
| 3 | 50 | 500 | 500 | 30 | 3.5 | 4.9 |
| 4 | 50 | 500 | 800 | 5 | 5.5 or more | 3.5 |
| 5 | 50 | 500 | 1000 | 5 | 5.5 or more | 3.3 |

As is apparent from Table 1, the adhesion strength increased with the temperature of thermal treatment performed after the pattern of the Ti/Cu two-layered structure was formed on the ceramic substrate. In particular, each of the circuit patterns formed on the circuit boards of No. 4 and No. 5 heated at temperatures higher than 600° C. had a high adhesion strength of 5.5 kg/m² or more and a low resistivity.

An AES analysis was performed for the circuit patterns formed on the circuit boards of No. 1 to No. 3 in Table 1. As a result, it was found that none of the bonding layer, the conductor layer, nor the protective layer having the compositions described above were formed in the circuit patterns of the circuit boards of No. 1 and No. 2. The circuit pattern of the circuit board of No. 3 was found to have the bonding layer, the conductor layer, and the protective layer. However, since the thermal treatment temperature was relatively low, 500° C., for the circuit board of No. 3, Ti of the thin Ti film on the surface of the substrate did not diffuse sufficiently toward the upper surface side of the thin Cu film through that Cu film. Consequently, Ti in an amount exceeding 5 atom % was contained in the thin Cu film (conductor layer). This increased the resistivity of this circuit pattern as in Table 1.

The AES analysis was similarly performed for the circuit patterns of the circuit boards of No. 4 and No. 5 in Table 1. As a result, it was confirmed that each pattern had the multilayered structure constituted by the bonding layer, the conductor layer, and the protective layer having the compositions described above.

EXAMPLE 3

A 150-nm thick bonding layer consisting of 92 atom % of Ti and 8 atom % of N, a 1,000-nm thick conductor layer consisting of Cu containing 1 atom % or less of Ti, and a 10-nm thick protective layer consisting of TiN (Ti; 50 atom %, N; 50 atom %) were stacked in sequence on each of the two surfaces of an AlN stacked substrate similar to that of Example 1 by using a sputter deposition system. These stacked layers on the two surfaces were sequentially, selectively patterned to form a circuit pattern and pin bonding regions, thereby fabricating a ceramic circuit board. Subsequently, the protective layer of the pin bonding regions was removed, and I/O pins consisting of Kovar were temporarily fixed to the conductor layer of the pin bonding regions by using a jig. Note that each I/O pin used had an Ag-Cu brazing material formed on its bonding end portion. Thereafter, thermal treatment was performed in a nitrogen atmosphere at 830° C. to bond the pins to the pin bonding regions with the Ag-Cu brazing material sandwiched between them. Even after this thermal treatment for bonding of the I/O pins, almost no changes were found in the compositions of the individual layers of the circuit pattern.

The resistivity of the circuit pattern on the surface of the circuit board thus obtained was measured. The circuit pattern was found to have a very low resistivity of 3.0 μΩ·cm both before and after bonding of the I/O pins. Following the same procedures as in Example 1, measurements were also performed for the tensile strengths of the circuit pattern and the I/O pins. Consequently, it was confirmed that the tensile strengths of both the circuit pattern and the pins were 5.5 kg/mm² or more both before and after bonding of the pins.

According to the present invention as has been described above, there is provided a circuit board which comprises a circuit pattern adhered firmly to a ceramic substrate and capable of maintaining a low initial resistivity by eliminating an increase in resistivity due to an influence of an external environment, particularly a thermal influence, and which is therefore suitable for a package of semiconductor devices, or the like.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. A circuit board, comprising:
   a ceramic substrate; and
   a circuit pattern formed on said substrate and having a multilayered structure in which a bonding layer comprising Ti and at least one element selected from the group consisting of N and O, a conductor layer consisting essentially of Cu and O to 5 atomic % of Ti, and a protective layer comprising Ti and at least one element selected from the group consisting of N and O are stacked in the order named.

2. The circuit board according to claim 1, wherein said ceramic substrate has a composition containing aluminum nitride as a main component.

3. The circuit board according to claim 1, wherein said bonding layer consists of 30 to 99.5 atom % of Ti and 0.5 to 70 atom % of at least one element selected from the group consisting of N and O.

4. The circuit board according to claim 1, wherein said bonding layer consists of 50 to 99.5 atom % of Ti and 0.5 to 50 atom % of at least one element selected from the group consisting of N and O.

5. The circuit board according to claim 1, wherein said bonding layer consists of Ti, at least one element selected from the group consisting of N and O, and Cu.

6. The circuit board according to claim 5, wherein Cu is contained in an amount of not more than 50 atom % in said bonding layer.

7. The circuit board according to claim 5, wherein Cu is contained in an amount of not more than 20 atom % in said bonding layer.

8. The circuit board according to claim 1, wherein said ceramic substrate has a composition containing aluminum nitride as a main component, and said bonding layer consists of Ti, at least one element selected from the group consisting of N and O, and aluminum of said substrate.

9. The circuit board according to claim 8, wherein aluminum of said substrate is contained in an amount of not more than 11 atomic % in said bonding layer.

10. The circuit board according to claim 1, wherein said conductor layer consists of Cu.

11. The circuit board according to claim 1, wherein said protective layer consists of 30 to 99.5 atom % of Ti and 0.5 to 70 atom % of at least one element selected from the group consisting of N and O.

12. The circuit board according to claim 1, wherein said protective layer consists of 33 to 66 atom % of Ti and 34 to 67 atom % of at least one element selected from the group consisting of N and O.

13. The circuit board according to claim 1, wherein said protective layer consists of Ti, at least one element selected from the group consisting of N and O, and Cu.

14. The circuit board according to claim 13, wherein Cu is contained in an amount of not more than 20 atom % in said protective layer.

15. The circuit board according to claim 13, wherein Cu is contained in an amount of not more than 5 atom % in said protective layer.

16. The circuit board according to claim 1, wherein said bonding layer has a thickness of 2 nm to 1,000 nm.

17. The circuit board according to claim 1, wherein said conductor layer has a thickness of 0.2 μm to 20 μm.

18. The circuit board according to claim 1, wherein said protective layer has a thickness of 5 nm to 1,000 nm.

* * * * *